United States Patent [19]
Kmetec et al.

[11] Patent Number: 5,757,831
[45] Date of Patent: May 26, 1998

[54] ELECTRONIC SUPPRESSION OF OPTICAL FEEDBACK INSTABILITIES IN A SOLID-STATE LASER

[75] Inventors: Jeffrey D. Kmetec, Los Gatos; Joseph J. Alonis, Palo Alto; Thomas J. Kane, Menlo Park, all of Calif.

[73] Assignee: Lightwave Electronics Corp., Mountain View, Calif.

[21] Appl. No.: 679,523

[22] Filed: Jul. 12, 1996

[51] Int. Cl.$^6$ .................................................. H01S 3/131
[52] U.S. Cl. .................................................. 372/38; 372/26
[58] Field of Search .................................. 372/26–28, 33, 372/38, 75, 108

[56] References Cited

U.S. PATENT DOCUMENTS

| | | | |
|---|---|---|---|
| 4,847,477 | 7/1989 | Smith | 250/201.9 |
| 5,123,023 | 6/1992 | Santarelli et al. | 372/38 |
| 5,177,755 | 1/1993 | Johnson | 372/38 |
| 5,214,666 | 5/1993 | Watanabe et al. | 372/69 |
| 5,253,267 | 10/1993 | Johnson | 372/38 |
| 5,296,695 | 3/1994 | Bardos et al. | 372/38 X |
| 5,335,239 | 8/1994 | Herczeg et al. | 372/38 |
| 5,420,611 | 5/1995 | Sarraf | 342/264 |

OTHER PUBLICATIONS

Kane, "Intensity Noise in Diode–Pumped Single–Frequency Nd:YAG Lasers and its Control by Electronic Feedback," *IEEE Photonics Technology Letters*, vol. 2, (Apr. 1990), pp. 244, 245.

Williams, "Composite Amplifiers," 1990 *Linear Applications Handbook; A Guide to Linear Circuit Design*, Linear Technology Corp., Milpitas, CA, 1990, pp. AN21-1–AN21-9 (Jul. 1986).

*Primary Examiner*—John D. Lee
*Attorney, Agent, or Firm*—Charles S. Guenzer

[57] ABSTRACT

A stabilized solid-state laser in a thermal imaging system in which a laser diode pumps the solid-state laser and a modulator modulates the laser beam according to graphical data to be recorded in a thermally sensitive medium, as is used in the graphics industry. The solid-state laser is stabilized against relaxation oscillations induced in the laser by modulated light reflected back from the thermally sensitive medium. The light reflected from the medium is allowed to reenter the solid-state laser, but the optical output of the solid-state laser is sampled in the frequency band in which relaxation oscillations occur. The detected intensity is then used in a feedback circuit to control the intensity of the diode laser that is optically pumping the solid-state laser. Thereby, the data modulation does not cause the solid-state laser to oscillate, and neither a Faraday rotator nor use of a diffracted beam is required.

24 Claims, 5 Drawing Sheets

5,757,831

ELECTRONIC SUPPRESSION OF OPTICAL FEEDBACK INSTABILITIES IN A SOLID-STATE LASER

FIELD OF THE INVENTION

The invention generally relates to solid-state lasers. In particular, it relates to an optical and electronic circuit usable with a solid-state laser to stabilize its output.

BACKGROUND ART

Lasers have been developed to have a sufficiently high optical output to be quite effective at thermal imaging. In conventional modern imaging in the graphics industry, the output beam from a diffraction-limited laser beam is modulated according an image to be recorded and focussed onto an imaging medium, such as lithographic film or printing plates. The focussed spot is scanned about the surface of the medium and, when properly modulated, forms the desired image. This technique is particularly used in outputting graphic images from a computer. Traditionally, the lasers of choice have been HeNe, ion lasers, or semiconductor diode lasers although diode-pumped solid-state lasers have been used in this application. Solid-state lasers have historically been pumped with arc lamps, pumping with laser diodes has become more popular recently because of their higher efficiency and longer lifetimes. As will be described below with respect to the invention, the use of laser diodes as the pump source allow for implementation of feedback control loops not feasible with traditional arc-lamp pumped lasers since the laser diodes can be modulated at high frequencies. Traditionally, also, the photosensitive medium has been silver-halide film or photopolymeric photosensitive medium.

An emerging technology is replacing the traditional photosensitive medium, such as photographic film, with thermally sensitive media. With such media, heat generated by a laser exposes the media, in contrast to the photo-activated chemical reactions of silver halide films. These thermally sensitive media require a higher exposure which is available most readily from the higher-intensity diode-pumped solid-state lasers capable of outputting optical power in the range of 5 to 20 W.

As illustrated in the schematical diagram of FIG. 1, a conventional solid-state laser system in this application includes a solid-state laser 10 and an integrated laser diode source 12. Such laser systems are well known and commercially available, for example, Model 220 available from Lightwave Electronics, Inc. of Mountain View, Calif. The solid-state laser 10 consists principally of a crystalline rod that has been doped with optically active ions to form an optically active lasing medium, for example, of Nd:YAG (yttrium aluminum garnet doped with neodymium). Mirrors at the two ends of the rod form an optical cavity, and when the lasing medium is optically pumped to a sufficient level the optical states are inverted and the medium lases if the cavity gain exceeds the cavity losses. One mirror is partially transmitting to extract a laser beam 14 from the rod. Commercial high-power solid-state lasers such as the above cited model are optically pumped by an array of laser diodes in the laser diode source 12 which irradiate the side of the laser rod with optical energy having a wavelength shorter than that desired from the solid-state laser 10.

A first lens system 18 focuses the laser beam 14 onto an optical modulator 20, such as an acousto-optical modulator, and a second lens system 22 refocuses the modulated laser beam onto the target 16 of the imaging. The optical modulator 20 is modulated according to imaging data 24 sequentially supplied to it from a controller processing the data 24. The presentation of imaging data 24 is synchronized with unillustrated scanning means which may include optical scanning means such as movable mirrors or mechanical scanning means such as a translatable mechanical stage bearing the target 16 or a combination of these or other means.

The system as described thus far suffers a stability problem with most thermally sensitive targets 16 which have not only a substantial absorption causing the thermal processing but also a finite reflectivity. When the modulator 20 is on (transmitting), the light is reflected back through the modulator to the lasing rod of the solid-state laser 10, but when the modulator is off (diverting or otherwise blocking the incident laser beam), there is no such optical feedback to the solid-state laser. Relatively uncontrolled reflectance back into the laser cavity is generally considered a problem, but is particularly troublesome for solid-state lasers, which suffer from relaxation oscillations, which have a resonance typically at a frequency between 50 and 500 kHz. If the imaging data 24 controlling the modulator 20 has a signal frequency, even locally in the signal train, at or near the relaxation resonance, the light reflected back into the solid-state laser 10 is modulated near the relaxation resonance causing the laser 10 to output an abnormally high level at this frequency. Since imaging data has a rich spectrum, it is highly likely that some part of an image will have data that modulates the modulator 20 within the relaxation resonance peak, producing an intensified laser output in this portion of the image. It is only necessary that at some time one strong Fourier component of the imaging data falls within the relaxation resonance peak for the laser output to be intensified during that time. Such uncontrolled variations in the laser intensity will degrade the quality of the imaging.

Relaxation oscillations are a problem with solid-state lasers incorporating a lasing medium and having a cavity lifetime shorter than the lifetime of the upper state of the medium. This situation occurs for many solid-state lasers incorporating the popular lasing media Nd:YAG (neodymium-doped yttrium aluminum garnet), Nd:YLF (Nd-doped yttrium lanthanum fluoride), Nd:YVO$_4$ (Neodymium-doped yttrium vanadate), Nd:glass, Yb:YAG, Er:glass, ruby, etc.

One standard commercial solution to this feedback ringing arising from relaxation oscillations is to install a Faraday isolator 26 between the output of the solid-state laser 10 and the modulator 20 to prevent any propagation of light backwardly towards the laser 10. Faraday isolators provide more than 30 dB of isolation, but they suffer several disadvantages for commercial applications. First, they are expensive, often constituting the most expensive component of the system. Secondly, the 30 dB of backward loss is accomplished with about 0.5 dB of forward loss. Any loss in high-power laser systems is costly.

Another standard solution, often used in conjunction with the Faraday isolator 26, uses the first-order diffracted beam from the acousto-optical modulator 24 to irradiate the target 16. Examples of such a modulator is Model 3200 available from Crystal Technology, Inc. and Model N15180 available from NEOS, Inc. As illustrated in the schematic diagram of FIG. 2, the acousto-optical modulator 24 includes a body 30 of an acousto-optical material such as TeO$_2$. A piezo-electric transducer 32 of, for example, lithium niobate is powered by an RF source 34, which is in turn modulated by the data source 24. When the RF source 34 is on, it sets up a periodic compression pattern 36, that is, an acoustic wave in the acousto-optical body 30, which extends across the body 30 in parallel to the transducer 32, and the period of the acoustic wave is inversely proportional to the frequency of the RF electrical signal. Because of the acousto-optical character of the body 30, the pattern 36 impressed on the body 30 represents a spatial modulation of the optical refractive index of the body 30. The pattern 36 thus represents a Bragg grating, and it is oriented perpendicularly to the laser beam 14. The Bragg grating 36, when the RF source 34 is on, diffracts a substantial portion of the laser beam 14 into a first-order diffracted beam 38 generally offset by an angle $\theta_B$ given by the Bragg diffraction equation. Higher-order diffracted beams are not represented. On the other hand, when the RF source 34 is off, the Bragg grating does not exist, and the laser beam 14 continues into a zero-order or undiffracted beam 40.

To reduce the optical feedback producing relaxation oscillations, it has been standard practice to place the target 16 in the first-order diffracted beam 38 and to absorb the zero-order beam 40 in an optical dump 42. This choice is made because the acousto-optical interaction shifts the optical frequency $f_O$ of the diffracted laser beam on each pass by the acoustical or RF frequency $f_{RF}$ for a total of $2 \cdot f_{RF}$. The NEOS modulator shifts the optical frequency by 200 MHz, and the resonant frequencies within the solid-state laser used in the experiments below are represented by a comb with a spacing of 500 MHz. As a result, the diffracted laser beam when it is reflected back into the solid-state laser 10 has a frequency that has been shifted by $f_{RF}$ and falls between the comb of resonant cavity frequencies. This offset is enough in conjunction with the Faraday rotator to prevent feedback relaxation oscillations. On the other hand, the zero-order beam 40 does not undergo an acousto-optical interaction producing the frequency shift, so that a reflected beam reenters the solid-state laser 10 at the original resonant frequency of the laser and can thus induce feedback relaxation oscillations.

Although this technique utilizing the first-order diffracted beam is effective at suppressing feedback relaxation oscillations, it incurs a power penalty because the intensity of the first-order diffracted beam 38, when the RF source 34 is active, is always less than the intensity of the zero-order beam 40 when the RF source 34 is inactive. Conversion efficiencies of up to 80% are available from the acousto-optical modulator, but the remaining power is wasted.

Yet other techniques have been suggested for eliminating the feedback problem. One general solution is to use polarizers and quarter-wave plates to circularly polarize the light incident on the target. Any light reflected backwardly will have the wrong circular polarization to traverse the polarizing elements in the reverse directions. However, this approach is insufficient in commercial applications. Maintaining the circular polarization downstream of the polarizers is in practice a difficult task. Furthermore, the isolation provided by the polarization technique is practically limited to about 20 dB, which is an generally inadequate level of isolation.

Another general solution is to carefully place and align the optical train to minimize the amount of reflected light returning to the laser. As an example of this, Sarraf in U.S. Pat. No. 5,420,611 suggests tilting the target to be non-perpendicular to the optical axis, thereby eliminating perpendicular specular reflection back to the laser. While this approach provides some improvement, it does not achieve the required level of immunity to feedback. For example, a speck of dust on an element of the intervening optics can provide enough feedback to ruin the most careful design.

The feedback problem described above is related to relative intensity noise (RIN) arising from relaxation oscillations in diode-pumped solid-state lasers. Kane describes this noise in "Intensity Noise in Diode-Pumped Single-Frequency Nd:YAG Lasers and its Control by Electronic Feedback," *IEEE Photonics Technology Letters*, vol. 2, 1990, pp. 244, 245. The optical noise output by the solid-state laser has a significant power peak at the frequency identified with the relaxation oscillation, typically in the range of 50 kHz to 500 kHz. Kane disclosed an electronic feedback method for reducing the relative intensity noise in the optical output. As illustrated in the circuit of FIG. 3, a beam splitter 50 divides the optical beam 14 output by the solid-state laser 10 into an output beam 52 and a feedback beam 54 that strikes a biased InGaAs photodiode 56. An amplifier 58 amplifies and isolates the electrical output of the photodiode 56, and a capacitor 60 acting as a high-pass filter capacitively couples the amplified feedback signal to a summing circuit 62, which also receives the current from a DC power supply 64. The summing circuit 60 combines the feedback signal and the DC bias signal to supply power to the laser diode 12 pumping the solid-state laser 10. The summing circuit 62 is arranged such that the feedback signal produces negative feedback, that is, an increased optical output results in the feedback signal decreasing the power supplied to the laser diode 12. Thereby, any optical output noise within the bandwidth of the electronic feedback circuit is immediately attenuated by applying an out-of-phase signal at the detected noise frequency to the power supply of the laser diode 12.

Johnson discloses in U.S. Pat. Nos. 5,177,755 and 5,253, 267 improved feedback circuits for use with the Kane laser system. Smith discloses in U.S. Pat. No. 4,847,477 a feed-forward method of correcting fluctuations in the output of a solid-state laser by detecting the phase noise and thereby correcting the size of the control signal for a modulator downstream of the laser. Smith also discloses stabilizing the output frequency of the laser based upon the laser frequency detected from the output of the laser.

The solutions of the prior art in stabilizing solid-state lasers are considered to be inadequate. It is greatly desired to stabilize such laser systems in an economical way that does not waste laser power.

SUMMARY OF THE INVENTION

The invention can be summarized as a method of stabilizing the output of a laser modulated by a data signal and incident upon a partially reflective target that reflects light back to the laser. According to the invention, the intensity of the laser beam is sampled, the detected intensity is fed back through an electronic stablizing circuit that controls the output power of the laser, e.g., by controlling the power applied to a laser diode pumping a solid-state laser. Thereby, relaxation oscillations of the solid-state laser are suppressed. The stabilizing circuit has a special design enabling it to control a feedback loop having non-uniform characteristics.

DETAILED DESCRIPTION OF THE PREFERRED EMBODIMENTS

Figure 1:
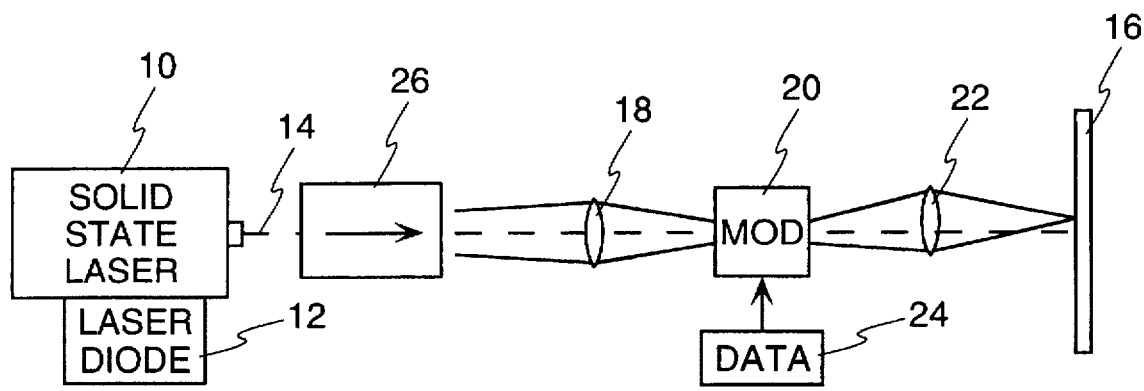
FIG. 1 is a schematic diagram of a conventional laser system used for thermal imaging.
Figure 2:
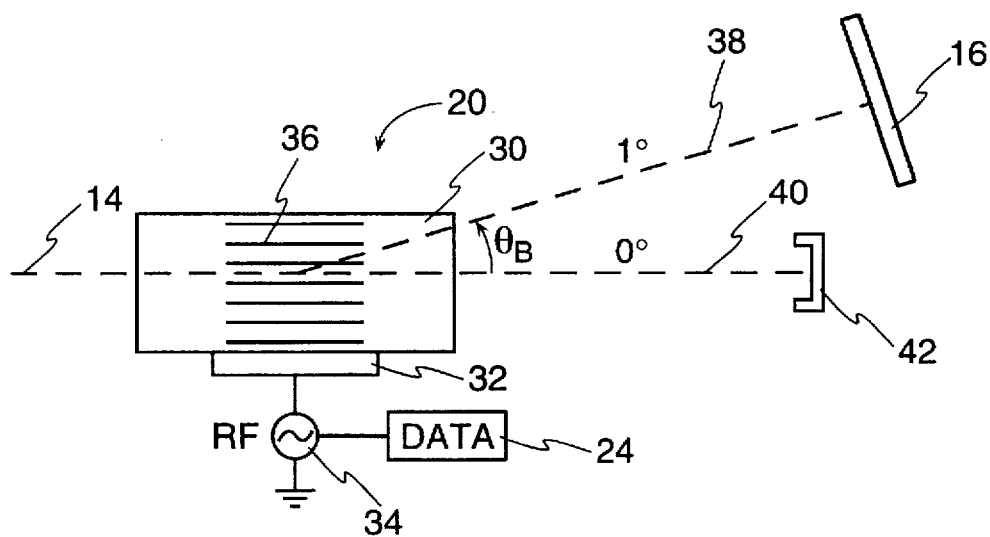
FIG. 2 is a schematic diagram of the arrangement of the acousto-optical modulator in a conventional thermal imaging system.
Figure 3:
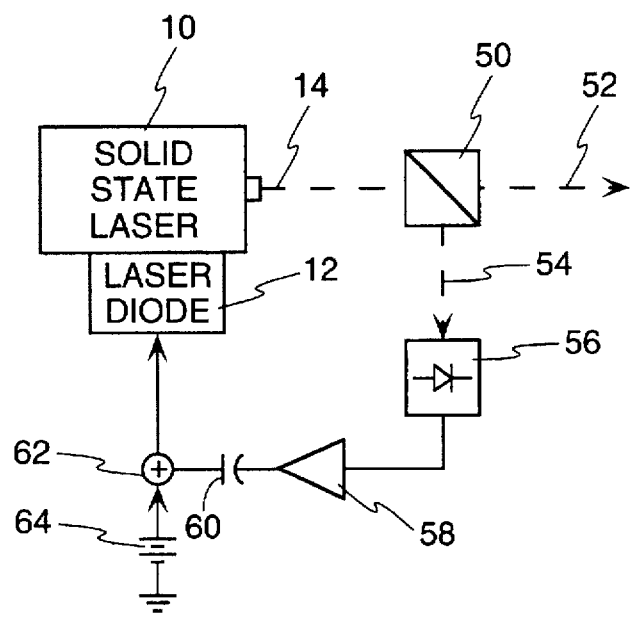
FIG. 3 is schematic diagram of a known laser system compensating for relative intensity noise.

We have found that electronic noise suppression, generally of the type disclosed by Kane, can effectively be used to suppress optical feedback noise without the use of an isolator. As illustrated in the schematical diagram of FIG. 4, the optical output of the solid-state laser 10 for the most part passes through the beam splitter 50 and is modulated by the modulator 20 before striking the target. The target scanning means are not illustrated. Inevitably, part of the light incident on the target is reflected back through the modulator to the solid-state laser 10.

If the laser light is being modulated by data 24 at a frequency near the relaxation resonance, i.e., between 10 kHz and 1 MHz, when the reflected light reenters the lasing medium of the solid-state laser 10, it will experience relatively high gain because it is within the relaxation resonance of the solid-state laser 10, i.e., the laser will significantly amplify the modulated reflected signal. The amplified signal will exit the solid-state laser 10 on the regular output beam 14, but the beam splitter 50 will direct a small fraction towards the photodiode 56. Preferably, the beam splitter 50 will separate out less than 5% of the incident optical power to the photodiode 56, and it may be formed simply of an angularly positioned glass plate. Alternatively, a photodetector can be placed at the back end of the laser rod, that is, the end opposite the output beam. The back mirror on the laser rod inevitably slightly leaks and the optical intensity within the cavity of the laser rod is sufficiently high that even a very small leakage will adequately drive the detector. All that is required is to sample either the optical intensity of the output beam or equivalently the optical intensity within the cavity, which is directly proportional to that of the output beam. The electronic feedback circuit will modulate the laser diode 12 pumping the solid-state laser 10 with a signal that is out of phase with the detected signal so as to suppress the optical resonance induced in the solid-state laser 10 by the modulated reflection.

The invention eliminates the need for an isolator to prevent feedback. Instead, the light propagates in both directions along a linear, bidirectional path. That is, there need be no explicit attempt to discriminate against the backwardly propagating light. By a bidirectional path is meant one in which the light is not significantly more attenuated in the backward direction than in the forward direction, for example, by no more than 3 dB difference and certainly no more than a 10 dB difference.

Figure 4:
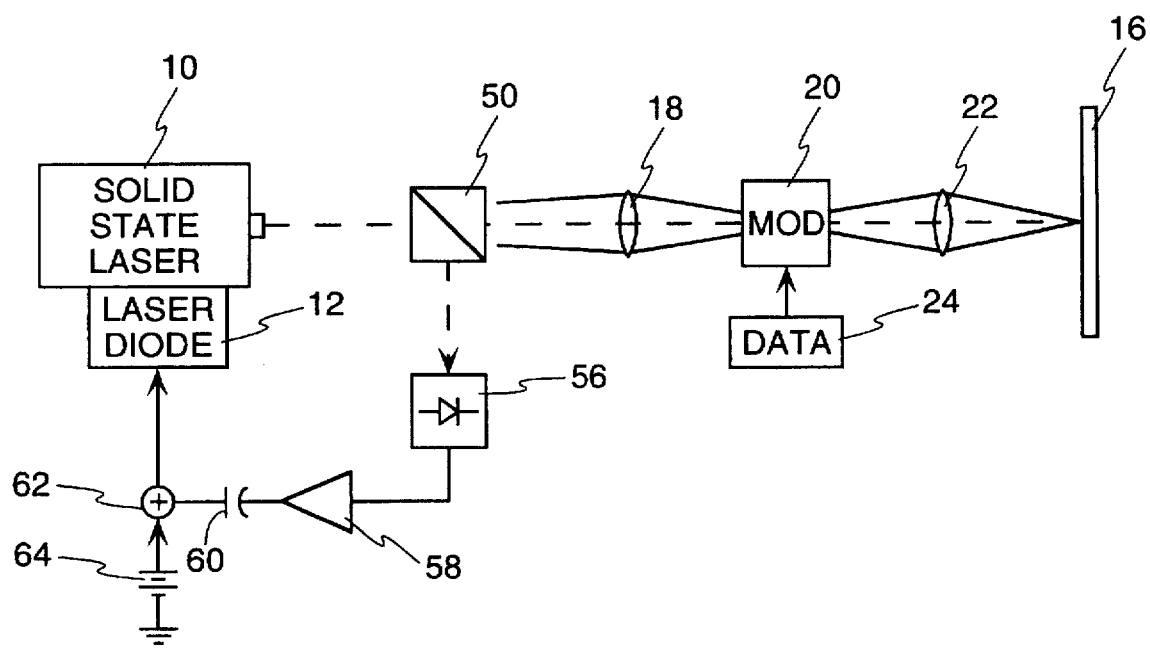
FIG. 4 is a schematic diagram of an embodiment of the invention compensating for feedback in a thermal imaging system.
Figure 5:
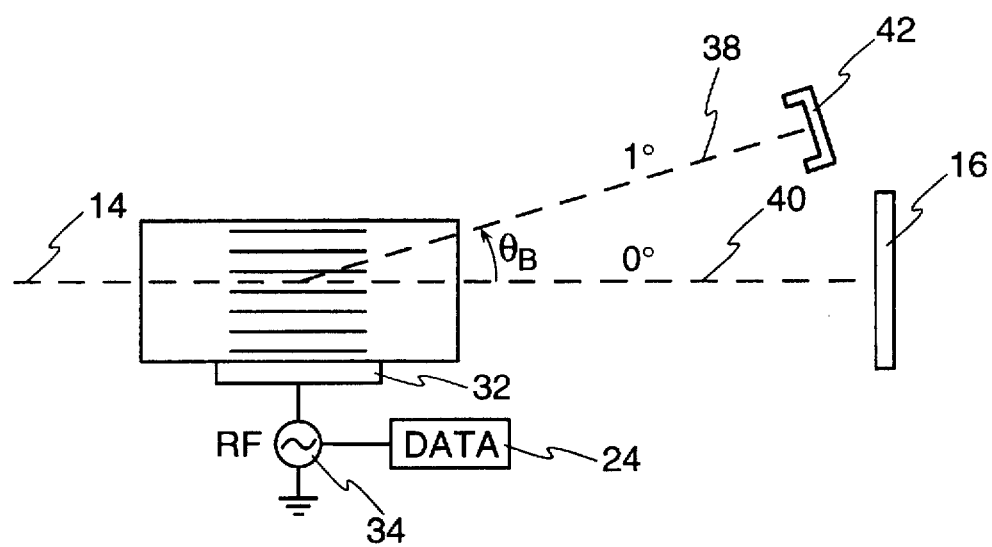
FIG. 5 is a schematic diagram of the arrangement of the acousto-optical modulator in the thermal imaging system of the invention.

The electronic feedback suppression of FIG. 4 has been found to be so effective that the modulated zero-order beam 40, as represented in the schematical illustration of FIG. 5, can be used to irradiate the target 16 without relaxation oscillations arising. That is, the target 16 is placed along the axis of the undeflected laser beam 14, and the first-order diffracted beam 38 is absorbed by the optical dump 42. With this reversal of beams, the data 24 needs to be adjusted to reflect the fact that an inactive RF signal represents data recorded in the target 16 while an active RF signal causes the laser beam 14 to be substantially reflected and to not record. Usually, the thermally sensitive material of the target, unlike photosensitive films and the like, has a threshold level which is below the residual zero-order intensity when the modulator is deflecting the beam, hence resulting in the desired non-exposure.

Although the electronic feedback circuit of FIG. 4 tends to reduce the intrinsic relative intensity noise addressed by Kane, the optical feedback instability addressed by the invention is a much larger effect than noise and is induced by outside causes. Hence, a much greater fraction of modulation of the laser diode control signal must be accommodated, and the design of the feedback circuit must emphasize the capability of large modulation rather than low noise.

Because the amplitude feedback stabilizing circuit works in frequency bands that include the frequency of the laser's relaxation oscillation, it must have certain gain and phase response characteristics to ensure that the system will not itself spontaneously oscillate. The laser has a characteristic response of amplitude and phase as measured from the pump light impressed onto the solid-state laser compared to the light output by the laser. This gain and phase response exhibits a dramatic change near the frequency of the laser's relaxation oscillation, and this change imposes the requirement that the electronic gain of the stabilizing circuit must increase with increasing frequency at and for some number of octaves above the frequency of the relaxation oscillation. The ratio of the frequency at which the electronic gain stops increasing divided by the laser's relaxation oscillation frequency determines how much overall gain the stabilizing circuit can have. The higher the gain, the less sensitive the laser will be and the lower the noise it will have. Thus, the gain-bandwidth product of the amplifier is key to the performance of the stabilizing circuit.

The ideal amplifier would have infinite gain and infinite bandwidth. Tradeoffs can be made in amplifier design to improve performance in a particular frequency band at the expense of performance in another band. Johnson discloses in U.S. Pat. No. 5,253,267 a scheme for a composite amplifier to optimize the circuit's response in several frequency bands at once. Composite amplifiers of many designs are well known in the art. Williams describes several in "Composite Amplifiers," 1990 *Linear Applications Handbook; A Guide to Linear Circuit Design*, Linear Technology Corp., Milpitas, Calif., 1990, pp. AN21-1–AN21-9. However, composite amplifiers have existed nearly as long as vacuum tubes. Essentially any combination or two or more amplifying elements, combined to achieve better performance than a single element, is a composite amplifier.

Although it is theoretically possible to divide up a frequency range into bands, amplify each separately, and then recombine the signals, this approach is often impractical because of resulting gaps or overlaps in the frequency coverage. In the stabilizing circuit required for the laser system of the invention, such gaps and overlaps result in frequencies at which the performance is compromised.

A particularly useful feedback amplifier employing active biasing has been designed and used to verify the operation of the invention. The amplifier follows the functional schematic of FIG. 6 to produce the gain and phase characteristics shown in FIG. 7.

The photodiode 56 samples the laser beam, and the resultant photocurrent induces a voltage across a monitoring resistor 72 between a monitoring node 70 and a voltage reference node 73. A differential amplifier 74 comparing its two inputs is connected across the monitoring resistor 72 to allow external monitoring of the laser output but is not used as part of the stabilizing circuit. The voltage reference node 73, on the side of the monitoring resistor 72 opposite the photodiode 56 and coupled to the negative DC power supply 78 by a capacitor 76, is driven by the output of an integrator 80. The integration provides the reference voltage against which the photodiode 56 drives photocurrent. A high-speed small-signal amplifier 82 amplifies the voltage at the monitoring node 70 between the photodiode 56 and the monitoring resistor 72. The output of the small-signal amplifier 82 is fed into a high-speed high-current buffer 84, the output of which is fed into the diode pump laser 12 through an AC coupling capacitor 85. A current regulator 64 supplies the main DC power to the diode pump laser 12, and an inductor 86 isolates the current regulator 64 from the stabilizing circuit. Because of the bandwidth requirement of the stabilizing circuit as well as the DC current requirement of the pump diode laser 12, the high-current buffer 84 is capable of supplying ±500 mA of correction current.

All the amplifiers in the circuit are DC coupled except for the output of the high-current buffer 84, which could be but was not in the prototype. Because of the high DC gain of the circuit, it is difficult to ensure that all active components are always operating in their normal linear regimes, that is, not limited by DC supply voltages or current limitations. Often, this difficulty can be eliminated by capacitively coupling together multiple stages, each having a smaller gain. See the previously cited article by Kane. The coupling capacitors would reduce the overall DC gain of the circuit to zero. However, in practice, these coupling capacitors not only block DC, they also limit the low-frequency performance of the stabilizing circuit. To overcome this design limitation, the preferred stabilization circuit employs active biasing in which the integrator 80 serves as a differential error amplifier and will adjust its output to the voltage reference node 73 to whatever voltage is required to keep the output of the small-signal amplifier 82 centered about the reference voltage 88 or $V_{REF}$. With proper design of the small-signal amplifier 82, control of its output voltage can guarantee that all intermediate stages are properly biased and operate in their linear regimes.

The feedback through the integrator 80 also has the effect of reducing the overall forward gain of the composite amplifier consisting of the small-signal amplifier 82, the high-current amplifier 84, and the integrator 80. However, since the integrator 80 does not lie within the critical signal path, it can be constructed as a filter with a sufficiently low pass such that the gain reduction only occurs at acceptably low frequencies. Computer modeling has shown that this technique can allow an amplifier to be constructed with a gain of $10^7$ and with constant gain in the baseband to below 1 Hz. However, the overall response cutoff of the composite amplifier at low frequency is strongly related to the enable/disable time of the circuit. Thus, there is a tradeoff in selecting the components for the integrator 80. For example, a circuit with a response down to 1 millihertz would take on the order of 1000 seconds to turn on.

Figure 6:
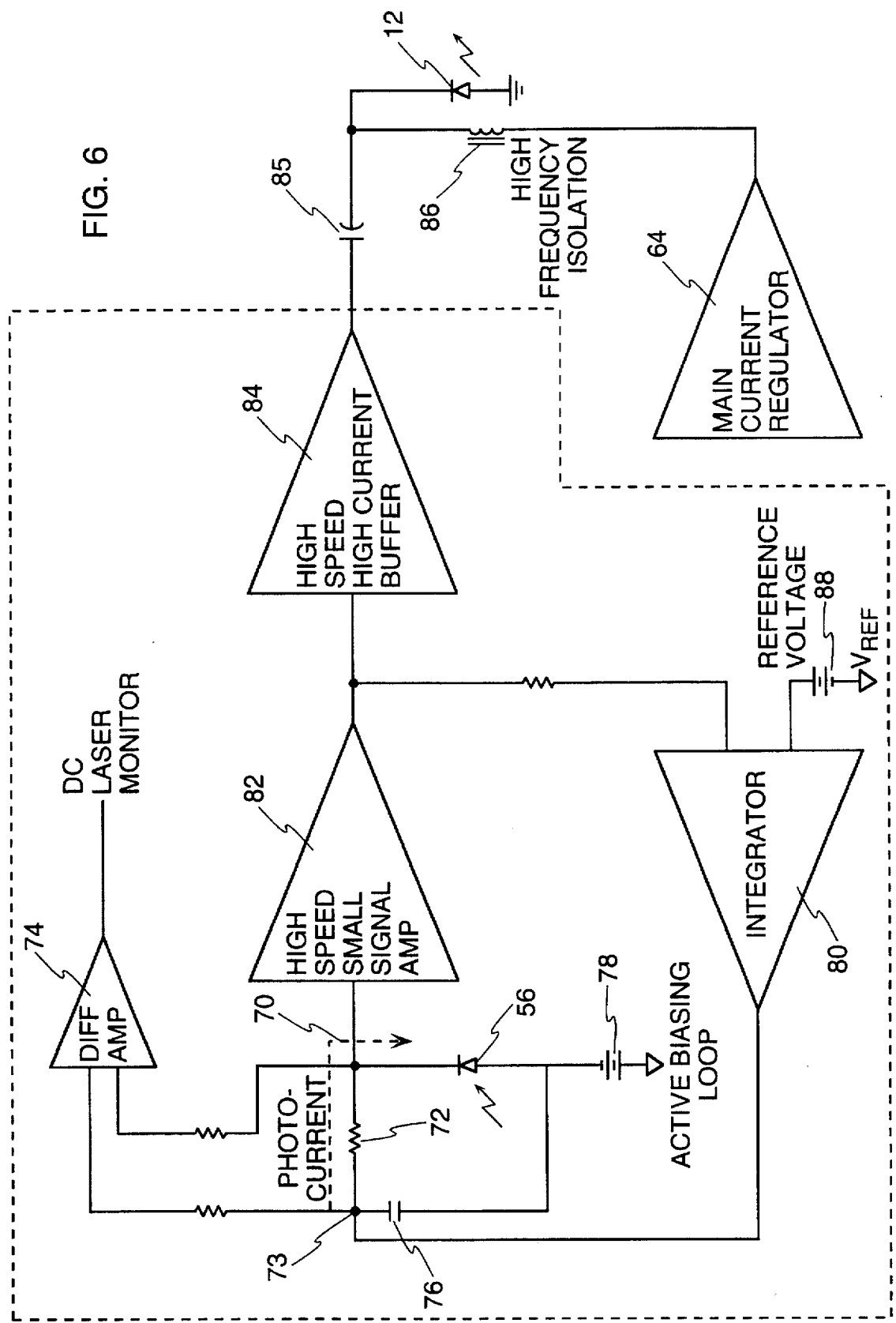
FIG. 6 is an electrical schematic of a particularly advantageous amplifier designed for the feedback circuit.
Figure 7:
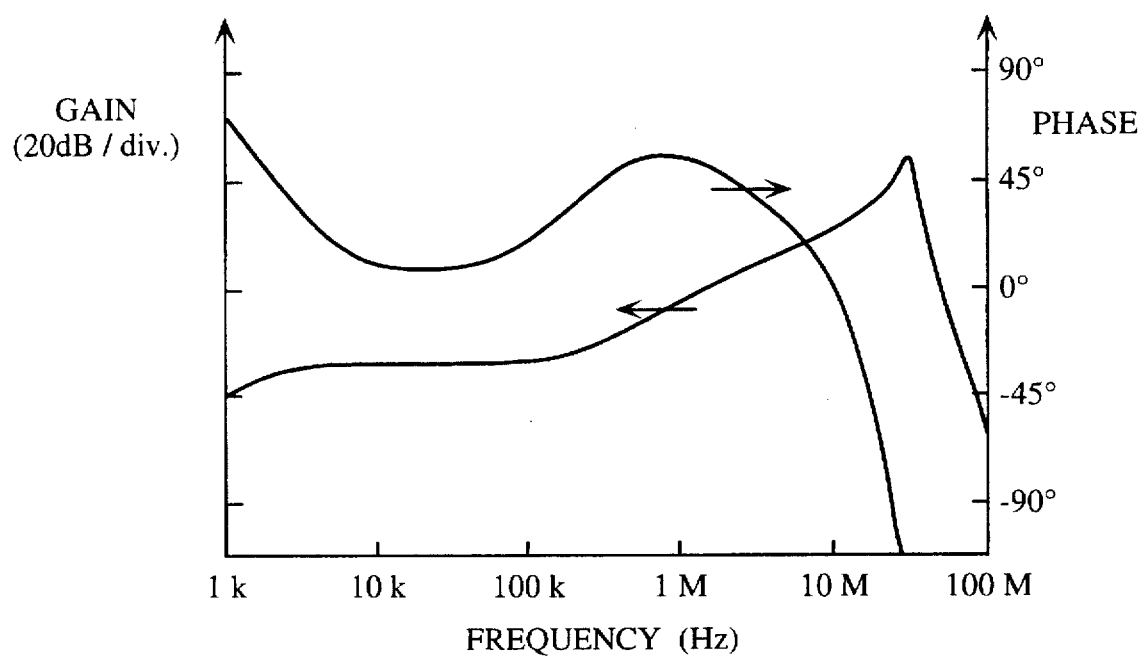
FIG. 7 is a graph of the transfer characteristic of the amplifier of FIG. 6.
Figure 8:
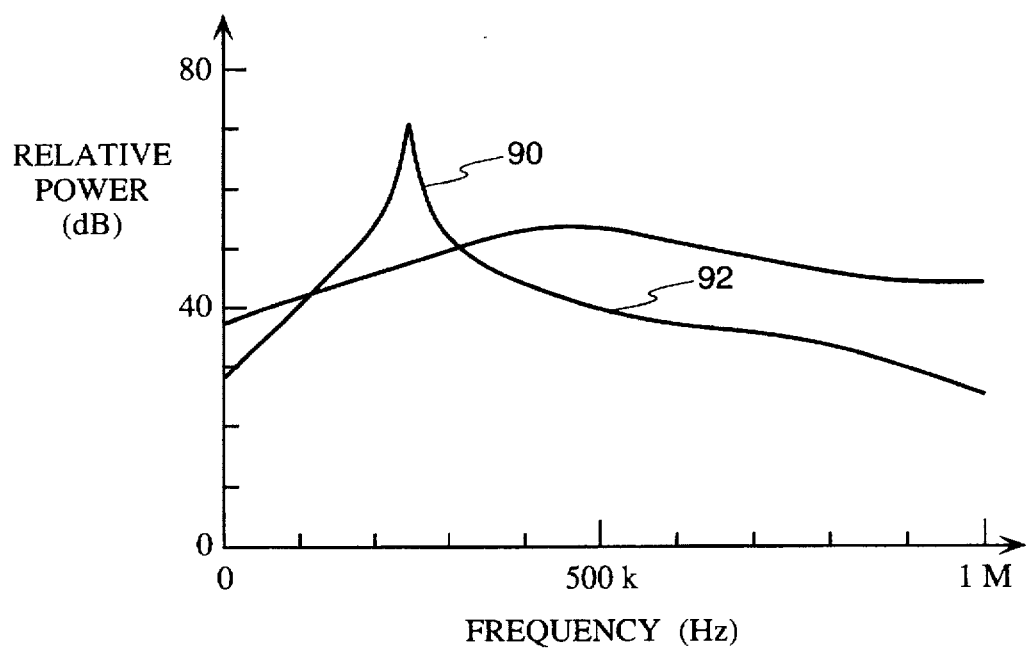
FIG. 8 is a graph of optical power spectra with and without use of the electronic feedback suppression of the invention

In the circuit of FIG. 6, the photocurrent 72 from the photodiode 56 is amplified by a factor in excess of $10^5$ in the baseband of the composite amplifier, with the gain increasing above 100 kHz and peaking at 20 MHz at a value of approximately $10^7$, where a gain of $10^6$ is a lower bound of this value. The composite amplifier has usable gain below 10 kHz. If the coupling capacitor 85 on the output is eliminated, then the low-frequency cutoff is determined by the integrator 80, and usable gain is extended to below 100 Hz. Thus, the amplifier exhibits high gain over 11 octaves.

With these performance parameters and a relaxation oscillation frequency of 200 kHz, the stabilization circuit can support a loop gain of nearly 100, that is, 40 dB. Immunity to feedback is improved by approximately the same factor. Practical manufacturing margin reduces the value of loop gain to 30, that is, 30 dB, and hence immunity to feedback is dependably improved by approximately 30 dB at baseband frequencies, by lesser amounts at frequencies above the relaxation oscillation frequency, and by much greater amounts at frequency near the relaxation oscillation frequency. This characteristic arises because the laser's amplitude response, that is, the laser light out divided by the pump light in, rises sharply near the relaxation oscillation frequency, and then continues to fall at higher frequencies even faster than the gain of the amplifier increases. Thus, the open loop gain of the laser and stabilization circuit increases near the relaxation oscillation frequency, and hence the stabilization circuit provides greater improvement at just those frequencies where the laser's inherent immunity is least. A stabilization circuit of this design desensitizes the laser to feedback at all frequencies, and the laser exhibits no particular sensitivity to feedback at any frequency.

Experiment

The laser system of FIGS. 4, 5, and 6 was tested both with and without the inventive feedback. An AC signal applied to the modulator 20 was swept in frequency, and the optical intensity of the output of the solid-state laser was monitored as a function of the AC frequency of the applied signal. In a comparative test, the electronic feedback circuit was disabled so that only a DC power signal was applied to the laser diode 12. As shown by trace 90 in the graph of FIG. 4, the response was sharply peaked in a frequency region around 240 kHz associated with relaxation oscillations. In a test of the invention, the electronic feedback circuit was enabled so as to control the power supply to the laser diode 12. As shown by trace 92, the relaxation oscillation peak was suppressed and the response was relatively flat, the variations probably having more to do with the measurement circuitry than with the laser output.

The invention can be implemented in many ways different from that described in the single illustrated embodiment. The beam sampling performed by the illustrated beam splitter 50 may be performed in many different ways, for example, the previously described weak transmission through a mostly reflective back mirror, and it the sampling may be performed between the modulator 20 and the target 16. Its primary requirement is to sample the optical output of the laser or a quantity closely related to it. The photodetector need not be a photodiode but need only be a photosensitive element capable of producing an electrical signal and being sensitive to intensity fluctuations in the range of 10 kHz to 1 MHz at the optical wavelength of the solid-state laser. The electronic feedback circuit can assume any form that produces stable negative feedback to suppress the relaxation oscillations of the solid-state laser. The DC and AC power supplied for the laser diode 12 may be combined in any number of ways including modulating the DC power supply. The target need not be a printing plate, but may be any thermally processed body that is recorded with a pattern.

Although the invention has been described with reference to acousto-optical modulators, other types of optical modulators can be used, specifically electro-optical modulators, especially since the higher-order diffracted beam is no longer needed to isolate the solid-state laser. Also, other types of optical pumps may be used than the described laser diode as long as they can be modulated at frequencies around the relaxation oscillation.

The invention thus provides an effective but economical method of controlling optical feedback in a laser modulation system. It also eliminates the power reduction caused in the prior art by the need for isolators.

What is claimed is:

1. A stabilized laser system, comprising:
   a solid-state laser including a laser diode pumping a lasing medium of said solid-state laser and outputting a laser beam along a first optical path;

an optical modulator disposed along said first optical path to receive said laser beam and modulating it according to a sequence of data to irradiate with said modulated laser beam a target disposed along said first optical path;

an optical detector disposed to detect an intensity of said laser beam; and an electronic feedback circuit receiving an output of said optical detector and controlling said laser diode in response thereto.

2. The laser system of claim 1, wherein said first optical path is bidirectional.

3. The laser system of claim 2, wherein said first optical path, apart from said modulator, is linear.

4. The laser system of claim 1, wherein said target is capable of reflecting some of said modulated laser beam back to said solid-state laser.

5. The laser system of claim 1, wherein said modulator is modulated with a data signal having a frequency component falling within a relaxation resonance of said solid-state laser.

6. The laser system of claim 1, wherein said modulator is modulated with a data signal having a frequency component within a frequency range of 10 kHz to 1 MHz.

7. The laser system of claim 1, wherein said modulator includes a medium selectively impressed by said sequence of data with a diffraction pattern and through which said laser beam passes, and further including a target disposed on a zero-order beam of said diffraction pattern.

8. The laser system of claim 1, wherein said electronic feedback circuit includes:
   a high-pass filter for said output of said optical detector;
   a DC bias supply; and
   a combining circuit for combining outputs of said high-pass filter and said DC bias supply to control said laser diode.

9. The laser system of claim 1, wherein said optical detector is disposed at an end of said solid-state laser opposite said laser beam.

10. The laser system of claim 1, wherein said electronic feedback circuit suppresses optical feedback reflected from said target and modulated by said modulator.

11. A thermal imaging system for thermally impressing a data signal on a thermally sensitive medium, comprising:
   a solid-state laser having an output beam propagating along a first optical path to said thermally sensitive medium;
   a laser diode pumping an active medium of said solid-state laser;
   a modulation system disposed along said first optical path to modulate said output beam according to said data signal;
   optical detection means for detecting an intensity of said output beam; and
   electronic feedback means receiving an output of said optical detection means and providing a negative feedback signal to said laser diode.

12. The imaging system of claim 11, wherein said first optical path has substantially equal loss characteristics for propagation in anti-parallel directions therealong.

13. The imaging system of claim 11, wherein said electronic feedback means suppresses optical feedback signals modulated by said modulation system.

14. A method of imaging a thermally sensitive target, comprising the steps of:
   modulating an optical output beam of solid-state laser at a point downstream from an output of said solid-state laser according to a sequence of data signals;
   scanning said modulated beam onto said thermally sensitive target to thereby impress an image of said sequence of data signals thereupon;
   detecting AC components of an intensity of said beam;
   in response to said detected AC components, producing a feedback signal;
   optically pumping an active medium in said solid-state laser with an optically emitting diode; and
   controlling an output of said optically emitting diode according to said feedback signal.

15. The method of claim 14, wherein said modulating step modulates said beam with frequency components corresponding to relaxation oscillations of said solid-state laser.

16. The method of claim 14, wherein said modulating step modulates said beam with frequency components in a range of 10 kHz to 1 MHz.

17. The method of claim 14, wherein said modulating step selectively diffracts said optical output beam away from said thermally sensitive target, a non-diffracted optical output beam being directed towards said thermally sensitive target.

18. The method of claim 14, wherein said controlling step suppresses optical feedback that has been modulated by said modulating step.

19. A feedback circuit in a laser system, comprising:
   a photodetector sampling an output of said laser system and biased between a voltage source and a monitoring node;
   a first amplifier receiving a signal from said monitoring node and outputting a signal to a first output node;
   a second, differential amplifier having two inputs, one connected to said first output node and a second connected to a reference potential;
   a resistor coupled between an output of said second amplifier and said monitoring node; and
   a third amplifier coupled on an input side to said first output node and driving a pump source of said laser system.

20. The feedback circuit of claim 19, wherein said first and third amplifiers are DC coupled.

21. The feedback circuit of claim 19, wherein said output of said second amplifier is capacitively coupled to said voltage source.

22. The feedback circuit of claim 19, wherein a gain of an electrical loop including said first amplifier, said second amplifier, and said resistor is at least 30 dB.

23. The feedback circuit of claim 19, wherein a current of said photodetector is amplified by a factor of at least $10^6$ at 20 MHz.

24. The apparatus of claim 19 including said laser system, wherein said laser system is a solid-state laser comprising:
   a laser diode acting as said pump source; and
   a lasing medium pumped by said laser diode and producing said output of said laser system.

* * * * *